(12) United States Patent
De et al.

(10) Patent No.: US 8,462,541 B2
(45) Date of Patent: Jun. 11, 2013

(54) CIRCUITS AND METHODS FOR REDUCING MINIMUM SUPPLY FOR REGISTER FILE CELLS

(75) Inventors: Vivek De, Beaverton, OR (US); DiaaEldin S. Khalil, Portland, OR (US); Muhammad Khellah, Tigard, OR (US); Moty Mehalel, Haifa (IL); George Shchupak, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/347,213

(22) Filed: Jan. 10, 2012

(65) Prior Publication Data

US 2012/0106285 A1    May 3, 2012

Related U.S. Application Data

(63) Continuation of application No. 12/291,433, filed on Nov. 10, 2008, now Pat. No. 8,111,579.

(51) Int. Cl.
  *G11C 11/00* (2006.01)
(52) U.S. Cl.
  USPC .......................................... 365/154; 365/156
(58) Field of Classification Search
  USPC .................. 365/154, 156, 230.05, 189.16
  See application file for complete search history.

(56) References Cited

U.S. PATENT DOCUMENTS

| | | | |
|---|---|---|---|
| 5,764,564 A * | 6/1998 | Frake et al. | 365/154 |
| 5,831,896 A * | 11/1998 | Lattimore et al. | 365/154 |
| 6,618,289 B2 * | 9/2003 | Pathak et al. | 365/185.25 |
| 7,324,368 B2 * | 1/2008 | Wang et al. | 365/154 |
| 7,403,426 B2 | 7/2008 | Hamzaoglu et al. | |
| 7,424,663 B2 | 9/2008 | Mehalel | |
| 2006/0109706 A1 | 5/2006 | Joshi | |
| 2007/0047364 A1 | 3/2007 | Chuang et al. | |
| 2007/0236983 A1 | 10/2007 | Wang et al. | |
| 2007/0242498 A1 | 10/2007 | Chandrakasan et al. | |
| 2007/0263447 A1 * | 11/2007 | Koike et al. | 365/185.18 |
| 2009/0172283 A1 | 7/2009 | Khellah et al. | |
| 2009/0213673 A1 | 8/2009 | Flautner et al. | |
| 2009/0323446 A1 | 12/2009 | Zhang et al. | |
| 2012/0147662 A1 * | 6/2012 | Yamaoka et al. | 365/156 |

OTHER PUBLICATIONS

Non-Final Office Action mailed Jan. 6, 2011 for U.S. Appl. No. 12/291,433.
Notice of Allowance mailed Sep. 27, 2011 for U.S. Appl. No. 12/291,433.
Notice of Allowance mailed Jun. 27, 2011 for U.S. Appl. No. 12/291,433.
Yamaoka et al., "90-nm Process-Variation Adaptive Embedded SRAM Modules with Power-Line-Floating Write Technique", IEEE Journal of Solid-State Circuits, vol. 41, No. 3, Mar. 2006, pp. 705-711.

* cited by examiner

*Primary Examiner* — Vu Le
(74) *Attorney, Agent, or Firm* — Blakely, Sokoloff, Taylor & Zafman LLP

(57) ABSTRACT

A register file employing a shared supply structure to improve the minimum supply voltage.

18 Claims, 5 Drawing Sheets

US 8,462,541 B2

CIRCUITS AND METHODS FOR REDUCING MINIMUM SUPPLY FOR REGISTER FILE CELLS

CLAIM OF PRIORITY

The present patent application is a Continuation of, and claims priority to and incorporates by reference in its entirety, the corresponding U.S. patent application Ser. No. 12/291,433, entitled, "CIRCUITS AND METHODS FOR REDUCING MINIMUM SUPPLY FOR REGISTER FILE CELLS" filed on Nov. 10, 2008, and issued as U.S. Pat. No. 8,111,579 on Feb. 7, 2012.

BACKGROUND

The minimum operational supply voltage (Vccmin) is an important parameter of today's processors. Reducing Vccmin is an important way to reduce the power consumption of a processor. Register files (RF) inside the processor are the limiting blocks in reducing Vccmin. RF Vccmin is typically the maximum of three components: write Vccmin, read Vccmin, and retention Vccmin. For register file cells, write Vccmin may be the worst of the three.

An example schematic diagram of a conventional 8-transistor RF cell is given in FIG. 1. In a write operation, the two write bit-lines (WRBL and WRBL#) are complementarily driven according to the data to be written into the cell. The write word-line (WRWL) is then set high so that data are written into the complementary nodes C1 and C2 of the RF cell via the write pass transistors PG1 and PG2, respectively. Unfortunately, a contention issue between the pass gate transistor (PG1 or PG2) that is to write a '1 into the cell and its associated pull-up transistor (P1 or P2, respectively) can occur, especially as the Vccmin level supplying the cell goes down.

A processor contains a very large number of RF cells. As a result, the statistical variations in the transistor characteristics can be as large as 5 or 6 times their standard deviations. Such statistical variations in the transistors of the cell can cause the pass gate transistor (PG1, PG2) to become too weak and the pull-up transistor (P1, P2) to become too strong, which may exacerbate the contention issue. As a result, such statistical variations may limit the Vccmin at which the cells can function properly.

Several approaches have been proposed to redress this issue. The traditional approach is to increase the sizing of the cell transistors either to make the pass NMOS transistors stronger or to reduce the statistical variations. However, this approach results in additional area, cost, and leakage power that are undesirable. Accordingly, new approaches to enable the reduction RF cell Vccmin may be desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
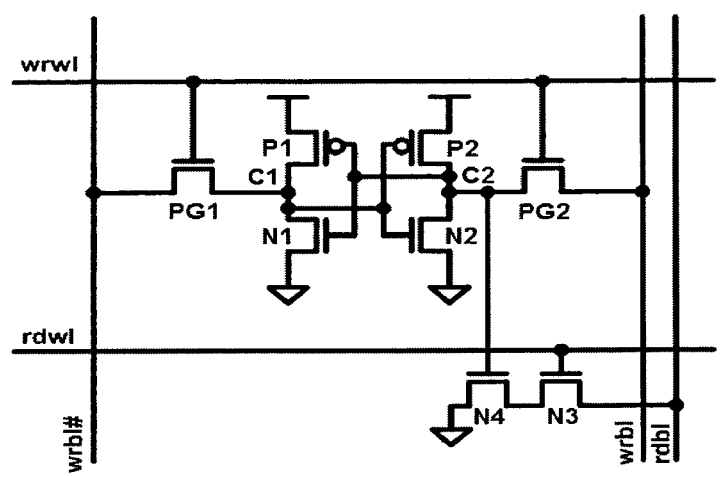
FIG. 1 is a schematic diagram of a conventional RF random access memory cell.
Figure 2:
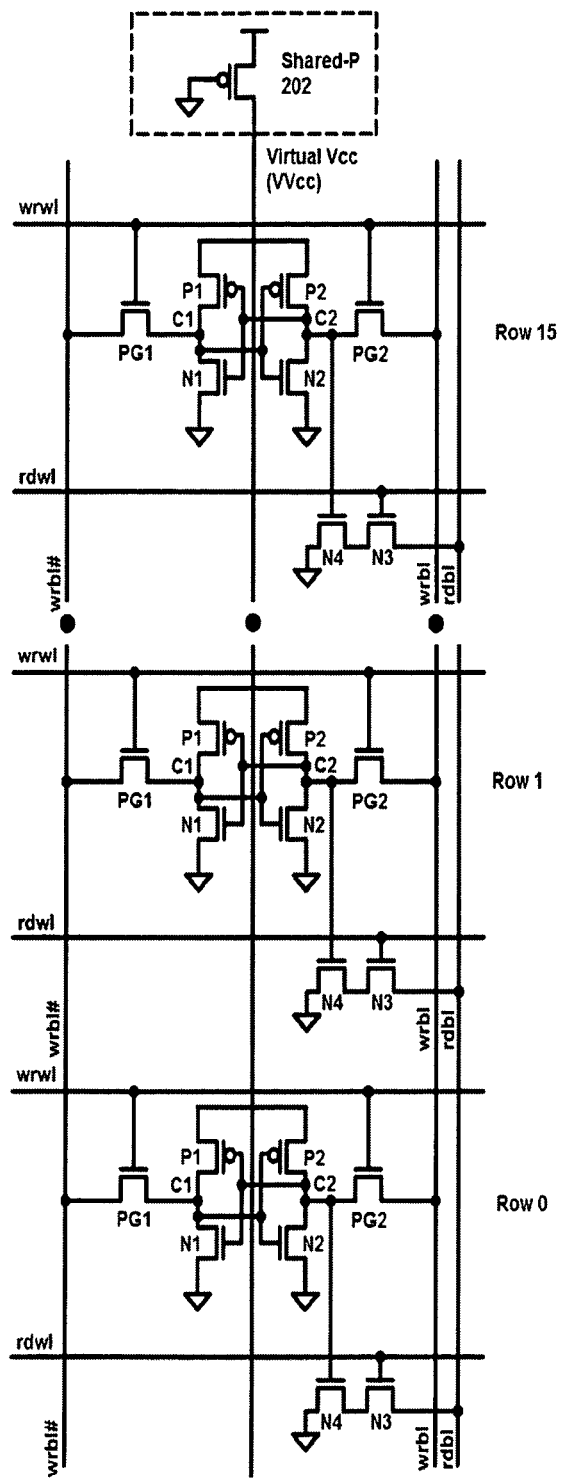
FIG. 2 is a schematic diagram of a group of RF cells with a shared supply transistor in accordance with some embodiments.

With reference to FIG. 2, an improved solution in accordance with some embodiments is shown. In some embodiments, RF cells are grouped such as the sixteen cell group shown in FIG. 2. With this structure, the RF cell itself may be the same as the traditional cell, but it is not connected directly to the supply (Vcc). Each group of cells is supplied through a shared PMOS transistor (or transistors) 202. The shared PMOS transistor (or transistors) 202 is always turned on (active) to provide a virtual Vcc signal (VVcc) to the connected group of cells.

The failure mechanism limiting the write Vccmin in the traditional RF is that the pass transistor PG1 or PG2 becomes too weak and the corresponding pull-up PMOS transistor P1 or P2 becomes too strong, due to the normal statistical variations. When a shared supply transistor solution (such as what is shown in FIG. 2) is used, the statistical variations affecting this failure mechanism may be distributed over two relevant PMOS devices rather than one; one in the RF cell and the other in the supply transistor group 202. As a result, the probability of getting a write failure may be reduced, and the write Vccmin at a given yield may be improved.

It should be appreciated that the shared supply transistor 202 may comprise one or more transistors, e.g., coupled together in parallel. Moreover, they may be programably connectable, e.g., through programably fusible connections, so that the strength of the shared supply transistor 202 can be adjusted, e.g., during the manufacturing process. Furthermore, while the shared supply transistor may be referred to as a shared-P transistor, it should not be limited to PMOS devices. Other types of transistors may be employed, depending upon design concerns and the states of relevant technology.

Figure 3A:
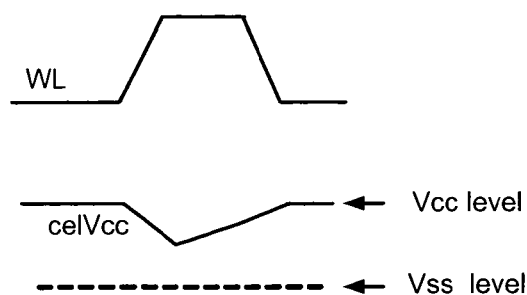
FIG. 3A is a timing diagram sketch partially illustrating the waveform of the virtual supply during a write operation for an RF cell with a shared supply transistor in accordance with some embodiments.
Figure 3B:
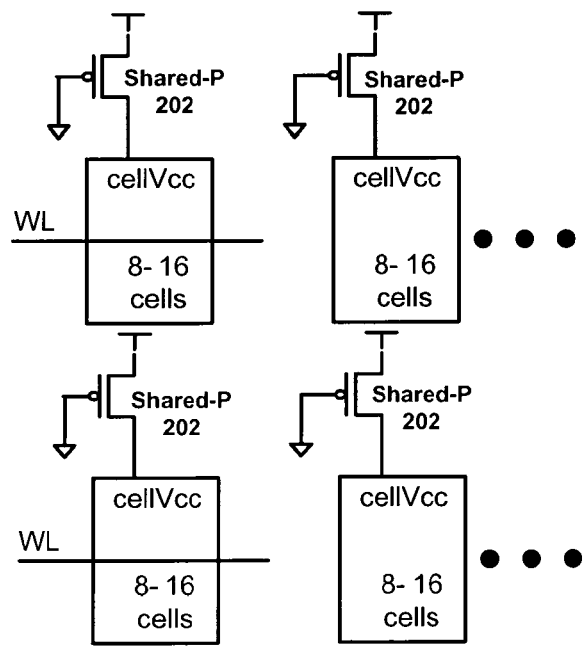
FIG. 3B is a diagram of a group of RF cells with a shared supply transistor for illustrating a write operation in cooperation with the timing diagram of FIG. 3A.

FIGS. 3A and 3B illustrate how the shared supply structure can improve write operation for cells in the shared supply group. The relatively weak shared PMOS supply transistors 202 (e.g., 1-4 times the strength of the pull-up PMOS transistors P1, P2) drive a small number of cells (e.g., 8-16), which reduces the capacitance as compare to a larger array of cells and makes the cells able to generate a voltage droop on the shared supply (VVcc) within the relatively short write pulse duration (e.g., in the pico-seconds range). As a result, the cell contention is reduced.

Figure 4:
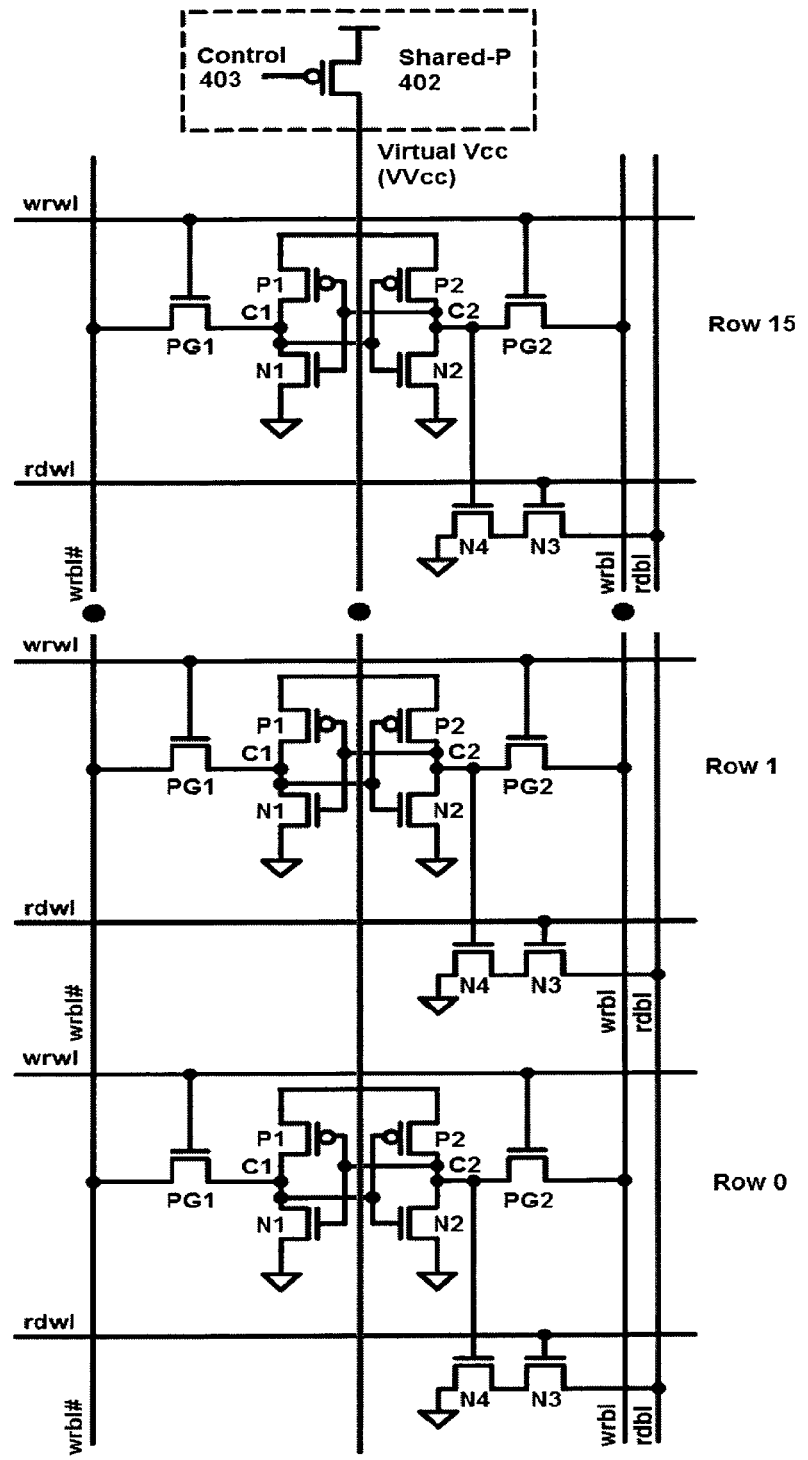
FIG. 4 is a schematic diagram of a group of RF cells with a shared supply transistor and control timing signal to provide a virtual supply signal to the connected group of RF cells in accordance with some embodiments.
Figure 5:
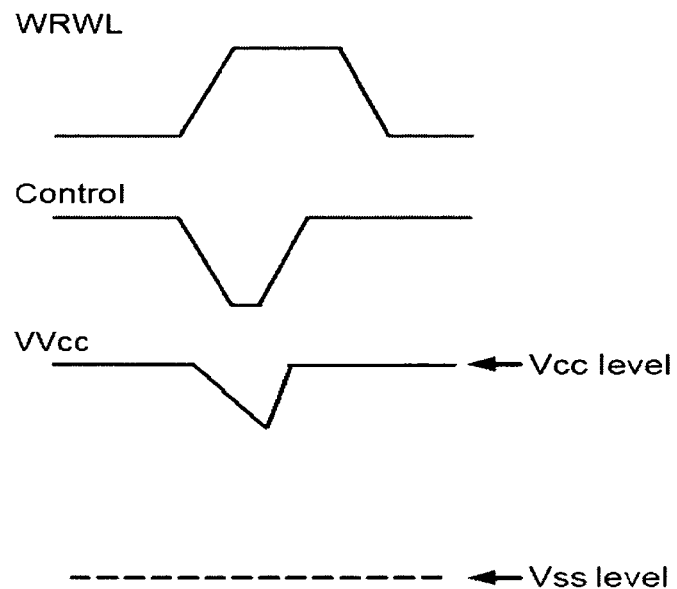
FIG. 5 is a timing diagram sketch partially illustrating the waveforms of the control timing signal and the virtual supply during a write operation for the RF cell with a shared supply transistor and control timing signal shown in FIG. 4 in accordance with some embodiments.

With reference to FIGS. 4 and 5, another embodiment utilizes a shared supply structure 402 with control timing signal 403, as shown in FIG. 4. The control timing signal 403 provides a tailored virtual supply VVcc signal to the connected group of RF cells. The write operation performance is controlled by two mechanisms: overcoming cell contention and write completion. This approach benefits from the fact that, during the write operation of an RF cell, overcoming contention comes earlier than write completion. To overcome contention, a reduced virtual supply drive and lower virtual supply voltage is desired. On the other hand, for write completion, a strong virtual supply drive and higher virtual supply voltage is desired. As a result, the virtual supply is floated (disconnected) during the early phase of a write operation to help overcoming the contention, then, the virtual supply is driven (connected) back, after that short time, to help the write completion. Such timing allows RF cells with more statistical variations to be successfully written resulting in additional improvement in write Vccmin.

FIG. 5 illustrates an example waveform of the control timing signal 403. The presented control timing signal employs a pulse to float the virtual supply of the group of cells. The employed pulse is generated during the early phase of the write operation to improve the performance of the write operation while not affecting the performance of other operations. The duration of the employed pulse is carefully designed to achieve the desired improvement in write Vccmin.

The shape and duration of the control timing signal may be programmable to allow post fabrication tuning. This may be desirable especially since the write Vccmin level typically depends on the frequency of operation. By having such flexibility, the Vccmin may be optimized or adjusted to salvage more chips at the desired performance.

While the previously mentioned embodiments are referring to RF or large-signal-arrays (LSA), they can be similarly applied to small-signal-arrays (SSA) employing, for example, 6T SRAM cells.

As mentioned above, the sizing of the transistor of the shared supply structure may be programmable, for example, via a set of fuses. This allows the sizing to be varied, for example, in the range of Z to 4Z, where Z is the RF cell pull-up sizing. By having such flexibility, the Vccmin may be optimized or adjusted to different skews of the utilized manufacturing process.

The shared supply structure transistors may be placed outside of the RF cells, for example, in the mid-logic region or the I/O region of the array and not in every cell. This allows the area penalty to become much smaller or even negligible. For example, if one shared supply structure is allocated per a group of 16 RF cells, and assuming that the area of the supply structure is half of one RF cell, then the effective area increase is 1/32 (3%).

Figure 6:
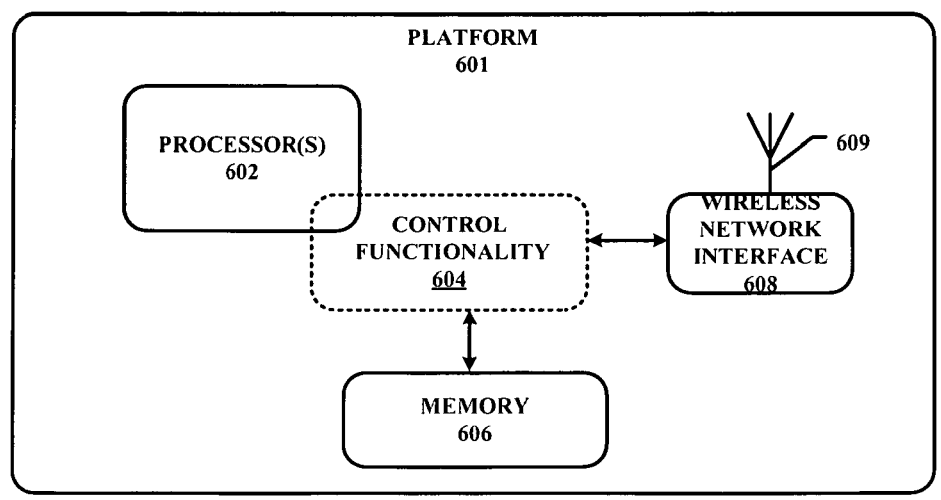
FIG. 6 is a block diagram of a computer system having a microprocessor with a register file having reduced supply voltage cells in accordance with some embodiments.

With reference to FIG. 6, one example of a portion of a computer platform 601 (e.g., computing system such as a mobile personal computer, PDA, cell phone, or the like) is shown. The represented portion comprises one or more processors 602, interface control functionality 604, memory 606, wireless network interface 608, and an antenna 609.

The processor(s) 602 is coupled to the memory 606 and wireless network interface 608 through the control functionality 604. The processor 602 has one or more register file (RF) arrays (not shown) with at least one group or plurality of cells having a common supply device, as taught herein. The control functionality may comprise one or more circuit blocks to perform various interface control functions (e.g., memory control, graphics control, I/O interface control, and the like. These circuits may be implemented on one or more separate chips and/or may be partially or wholly implemented within the processor(s) 602.

The memory 606 comprises one or more memory blocks to provide additional random access memory to the processor(s) 602. It may be implemented with any suitable memory including but not limited to dynamic random access memory, static random access memory, flash memory, or the like. The wireless network interface 408 is coupled to the antenna 409 to wirelessly couple the processor(s) 602 to a wireless network (not shown) such as a wireless local area network or a cellular network.

The platform 601 may implement a variety of different computing devices or other appliances with computing capability. Such devices include but are not limited to laptop computers, notebook computers, personal digital assistant devices (PDAs), cellular phones, audio and/or or video media players, and the like. It could constitute one or more complete computing systems or alternatively, it could constitute one or more components useful within a computing system.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit (IC) chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the presented figures, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

We claim:

1. An apparatus comprising:
    a memory cell; and
    a transistor, coupled to the memory cell, which is operable to provide a virtual power supply to transistors of the memory cell,
        wherein the transistor is operable to float the virtual power supply during a first phase of write operation,
        wherein the transistor has a gate terminal which is coupled to a node having a control signal, and
        wherein the transistor is coupled to a logic unit which is operable to adjust shape or timing of the control signal.
2. The apparatus of claim 1, wherein the transistor is operable to provide the virtual power supply to the memory cell after the first phase of write operation, and wherein the transistor comprises a plurality of transistors coupled in parallel to one another.
3. The apparatus of claim 2, wherein each transistor of the plurality of transistors is operable to receive a control signal to:
    turn on the transistor;
    turn off the transistor; or
    change current drive strength of the transistor.
4. The apparatus of claim 1, wherein the transistor is coupled to a plurality of memory cells to provide the virtual power supply to the plurality of memory cells, and wherein the memory cell is part of the plurality of memory cells.
5. The apparatus of claim 1, wherein the transistor is P-type transistor.
6. The apparatus of claim 1, wherein the transistor is coupled to a logic unit that generates the control signal, and wherein the logic unit is operable to cause the transistor to droop the virtual power supply.
7. The apparatus of claim 1, wherein the control signal is at least one of:
    a programmable signal; or
    a logical low level signal.
8. The apparatus of claim 1, wherein the memory cell is at least on of:
    a 6T SRAM cell;
    a 8T cell; or
    a 16T cell.
9. The apparatus of claim 1, wherein the transistor is operable to droop the virtual power supply.
10. The apparatus of claim 9, wherein the transistor is operable to droop the virtual power supply when a write operation for the memory cell is enabled.
11. The apparatus of claim 9, wherein the memory cell includes transistors having sizing to be such that the droop to the virtual power supply is large enough for conducting a write operation for the memory cell but short enough in duration to avoid data loss in a non written-to cell.
12. The apparatus of claim 1, wherein the transistor is operable to disconnect the virtual power supply from a main power supply.
13. A processor comprising:
    a group of memory cells; and
    a transistor, coupled to the group of memory cells, which is operable to provide a virtual power supply to the group of memory cells,
        wherein the transistor is operable to float the virtual power supply during a first phase of write operation,
        wherein the transistor has a gate terminal which is coupled to a node having a control signal, and
        wherein the transistor is coupled to a logic unit which is operable to adjust shape or timing of the control signal.
14. The processor of claim 13, wherein the transistor comprises a plurality of transistors coupled in parallel to one another, and wherein each transistor of the plurality of transistors is operable to receive the control signal to:
    turn on the transistor;
    turn off the transistor; or
    change current drive strength of the transistor.
15. The processor of claim 13, wherein the transistor is coupled to a logic unit which is operable to generate the control signal for the transistor, wherein the logic unit is operable to cause the transistor to droop the virtual power supply, and wherein the transistor is operable to provide the virtual power supply to the group of memory cells after the first phase of write operation.
16. A system comprising:
    a wireless network interface; and
    a processor communicatively coupled to the wireless network interface, the processor including:
        a memory cell; and
        a transistor, coupled to the memory cell, which is operable to provide a virtual power supply to transistors of the memory cell,
            wherein the transistor is operable to float the virtual power supply during a first phase of write operation,
            wherein the transistor has a gate terminal which is coupled to a node having a control signal, and
            wherein the transistor is coupled to a logic unit which is operable to adjust shape or timing of the control signal.

17. The system of claim 16, wherein the memory cell is at least one of:
- a 6T SRAM cell;
- a 8T cell;
- a 16T cell;
- DRAM cell; or
- flash memory cell.

18. The system of claim 16, wherein the transistor is coupled to a logic unit which is operable to generate the control signal for the transistor, wherein the logic unit is operable to cause the transistor to droop the virtual power supply, and wherein the transistor is operable to provide the virtual power supply to the memory cell after the first phase of write operation.

* * * * *